US012476069B2

(12) United States Patent
Wieland

(10) Patent No.: US 12,476,069 B2
(45) Date of Patent: Nov. 18, 2025

(54) CHARGED PARTICLE ASSESSMENT TOOL, INSPECTION METHOD

(71) Applicant: ASML NETHERLANDS B.V., Veldhoven (NL)

(72) Inventor: Marco Jan-Jaco Wieland, Delft (NL)

(73) Assignee: ASML NETHERLANDS B.V., Veldhoven (NL)

( * ) Notice: Subject to any disclaimer, the term of this patent is extended or adjusted under 35 U.S.C. 154(b) by 390 days.

(21) Appl. No.: 17/912,608

(22) PCT Filed: Apr. 4, 2021

(86) PCT No.: PCT/EP2021/058824

§ 371 (c)(1),
(2) Date: Sep. 19, 2022

(87) PCT Pub. No.: WO2021/204734

PCT Pub. Date: Oct. 14, 2021

(65) Prior Publication Data

US 2023/0125800 A1 Apr. 27, 2023

(30) Foreign Application Priority Data

Apr. 6, 2020 (EP) .................................... 20168278

(51) Int. Cl.
*H01J 37/147* (2006.01)

(52) U.S. Cl.
CPC ... *H01J 37/1477* (2013.01); *H01J 2237/0453* (2013.01); *H01J 2237/31774* (2013.01)

(58) Field of Classification Search
None
See application file for complete search history.

(56) References Cited

U.S. PATENT DOCUMENTS 9,607,806 B2 3/2017 Zonnevylle et al.
9,620,328 B1 * 4/2017 Cook .................... H01J 37/147
(Continued)

FOREIGN PATENT DOCUMENTS

CN 102460630 5/2012
EP 2715768 4/2014
(Continued)

OTHER PUBLICATIONS

Office Action issued in corresponding Taiwanese Patent Application No. 110112244, dated Jan. 2, 2024.
(Continued)

*Primary Examiner* — Robert H Kim
*Assistant Examiner* — Alina Kaliszewski
(74) *Attorney, Agent, or Firm* — Pillsbury Winthrop Shaw Pittman, LLP

(57) ABSTRACT

A charged-particle tool including: a condenser lens array configured to separate a beam of charged particles into a first plurality of sub-beams along a respective beam path and to focus each of the sub-beams to a respective intermediate focus; an array of objective lenses, each objective lens configured to project one of the plurality of sub-beams onto a sample; a corrector including an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams; and an electric power supply configured to apply a potential difference between the pair of elongate electrodes so as to deflect the second plurality of sub-beams by a desired amount.

20 Claims, 11 Drawing Sheets

(56) References Cited

U.S. PATENT DOCUMENTS

| | | | | |
|---|---|---|---|---|
| 2002/0009901 | A1* | 1/2002 | Maehara | H01J 37/3174 438/795 |
| 2004/0056193 | A1 | 3/2004 | Kienzle et al. | |
| 2004/0084621 | A1 | 5/2004 | Kienzle et al. | |
| 2005/0087701 | A1 | 4/2005 | Lammer-Pachlinger et al. | |
| 2005/0201246 | A1 | 9/2005 | Buschbeck et al. | |
| 2006/0237659 | A1* | 10/2006 | Feuerbaum | H01J 37/3177 250/396 ML |
| 2008/0121803 | A1* | 5/2008 | Shojo | H01J 37/153 250/311 |
| 2010/0276606 | A1* | 11/2010 | Baars | B82Y 40/00 250/396 R |
| 2012/0241641 | A1 | 9/2012 | Sano et al. | |
| 2012/0256098 | A1* | 10/2012 | Biberger | H01J 37/28 250/396 R |
| 2012/0273690 | A1* | 11/2012 | Wieland | B82Y 40/00 250/396 R |
| 2013/0011289 | A1 | 1/2013 | Flenche | |
| 2013/0112891 | A1 | 5/2013 | Kato | |
| 2013/0344700 | A1* | 12/2013 | Yamanaka | H01J 37/3007 438/712 |
| 2016/0111246 | A1 | 4/2016 | Matsumoto | |
| 2017/0243717 | A1 | 8/2017 | Kruit | |
| 2019/0013176 | A1 | 1/2019 | Breuer | |
| 2019/0259564 | A1* | 8/2019 | Kruit | H01J 37/1475 |

FOREIGN PATENT DOCUMENTS

| | | | |
|---|---|---|---|
| EP | 3863040 | 8/2021 | |
| EP | 3869535 | 8/2021 | |
| JP | 2012525698 | 10/2012 | |
| JP | 2013102060 | 5/2013 | |
| JP | 2014041936 | 3/2014 | |
| JP | 2014513432 | 5/2014 | |
| JP | 2019186140 | 10/2019 | |
| TW | 201310174 | 3/2013 | |
| TW | 201515044 | 4/2015 | |
| TW | I497557 | 8/2015 | |
| TW | 201546861 | 12/2015 | |
| TW | I534849 | 5/2016 | |
| TW | I646568 | 1/2019 | |
| WO | 2004081910 | 9/2004 | |
| WO | WO-2009127659 A2 * | 10/2009 | B82Y 10/00 |
| WO | 2012148267 | 11/2012 | |
| WO | WO-2021078352 A1 * | 4/2021 | H01J 37/28 |

OTHER PUBLICATIONS

International Search Report and Written Opinion issued in corresponding PCT Patent Application No. PCT/EP2021/058824, dated Sep. 13, 2021.

Taiwanese Office Action issued in corresponding Taiwanese Patent Application No. 110112244, dated Jan. 4, 2022.

Office Action issued in corresponding Korean Patent Application No. 10-2022-7034884, dated Sep. 9, 2024.

Search Report issued in corresponding Taiwanese Patent Application No. 110112244, dated Jul. 25, 2023.

Office Action issued in corresponding Chinese Patent Application No. 202180026727.5, dated Jul. 26, 2025.

* cited by examiner

CHARGED PARTICLE ASSESSMENT TOOL, INSPECTION METHOD

CROSS-REFERENCE TO RELATED APPLICATIONS

This application is the U.S. national phase entry of PCT Patent Application No. PCT/EP2021/058824 which was filed on Apr. 4, 2021, which claims priority of European Patent Application No. 20168278.8, which was filed on 6 Apr. 2020 and which is incorporated herein its entirety by reference.

FIELD

The embodiments provided herein generally relate to a charged particle assessment tools and inspection methods, and particularly to charged particle assessment tools and inspection methods that use multiple sub-beams of charged particles, as well as to a corrector arrangement for use in such tools or methods.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

There is a general need to improve the throughput and other characteristics of a charged particle inspection apparatus.

SUMMARY

The embodiments provided herein disclose a charged particle beam inspection apparatus.

According to a first aspect of the invention, there is provided a charged-particle tool comprising:

- a condenser lens array configured to separate a beam of charged particles into a first plurality of sub-beams along a respective beam path and to focus each of the sub-beams to a respective intermediate focus;
- an array of objective lenses, each configured to project one of the plurality of charged-particle beams onto a sample;
- a corrector comprising an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams; and
- an electric power supply configured to apply a potential difference between the pair of elongate electrodes so as to deflect the second plurality of sub-beams by a desired amount.

According to a second aspect of the invention, there is provided a charged-particle tool comprising:

- a condenser lens array configured to separate a beam of charged particles into a plurality of sub-beams along a respective beam paths and to focus each of the sub-beams to a respective intermediate focus;
- an objective lens array configured to project the plurality of charged-particle beams onto a sample;
- a corrector array comprising a plurality of elongate electrodes, the elongate electrodes arranged substantially orthogonal to the beam paths and in pairs either side of a line of beam paths; and
- wherein the corrector array is controllable to apply a potential difference between the pair of elongate electrodes so as to deflect the beam paths by a desired amount.

According to a third aspect of the invention, there is provided a charged-particle tool comprising:

- a condenser lens array configured to separate a beam of charged particles into a plurality of sub-beams along a respective beam paths and to focus each of the sub-beams to a respective intermediate focus;
- an objective lens array configured to project the plurality of charged-particle beams onto a sample;
- a corrector array comprising a plurality of elongate electrodes, the elongate electrodes arranged substantially orthogonal to the beam paths and in pairs either side of each beam path; and
- wherein the corrector array is controllable to apply macro-aberration corrections to the sub-beams orthogonal to the direction of the elongation of the elongate electrodes.

According to a fourth aspect of the invention, there is provided an inspection method comprising:

- dividing a beam of charged particles into a plurality of sub-beams;
- focusing each of the sub-beams to a respective intermediate focus;
- using a corrector to deflect the sub-beams to correct a macro-aberration of the sub-beams; and
- using a plurality of objective lenses to project the plurality of charged-particle beams onto the sample; wherein the corrector comprises an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams.

According to a fifth aspect of the invention, there is provided a multi-beam charged-particle-optical system comprising:

a condenser lens array configured to separate a beam of charged particles into a first plurality of sub-beams along a respective beam path and to focus each of the sub-beams to a respective intermediate focus;

an array of objective lenses, each configured to project one of the plurality of charged-particle beams onto a sample;

a corrector comprising an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams; and an electric power supply configured to apply a potential difference between the pair of elongate electrodes so as to deflect the second plurality of sub-beams by a desired amount.

According to a sixth aspect of the invention, there is provided a charged-particle-optical element for a multi-beam projection system configured to project a plurality of charged particle beams onto a sample, the charged-particle-optical element comprising:

an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams; and an electric power supply configured to apply a potential difference between the pair of elongate electrodes so as to deflect the second plurality of sub-beams by a desired amount.

According to a seventh aspect of the invention, there is provided a charged-particle-optical element for a multi-beam projection system configured to project a plurality of charged particle beams onto a sample, the last charged-particle-optical element comprising:

a first support member comprising a first plate section and a plurality of first fingers projecting from an edge of the first plate section;

a second support member comprising a second plate section and a plurality of second fingers projecting from an edge of the second plate section;

a first plurality of electrodes extending from the first fingers to the second plate section; and a second plurality of electrodes extending from the second fingers to the first plate section.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
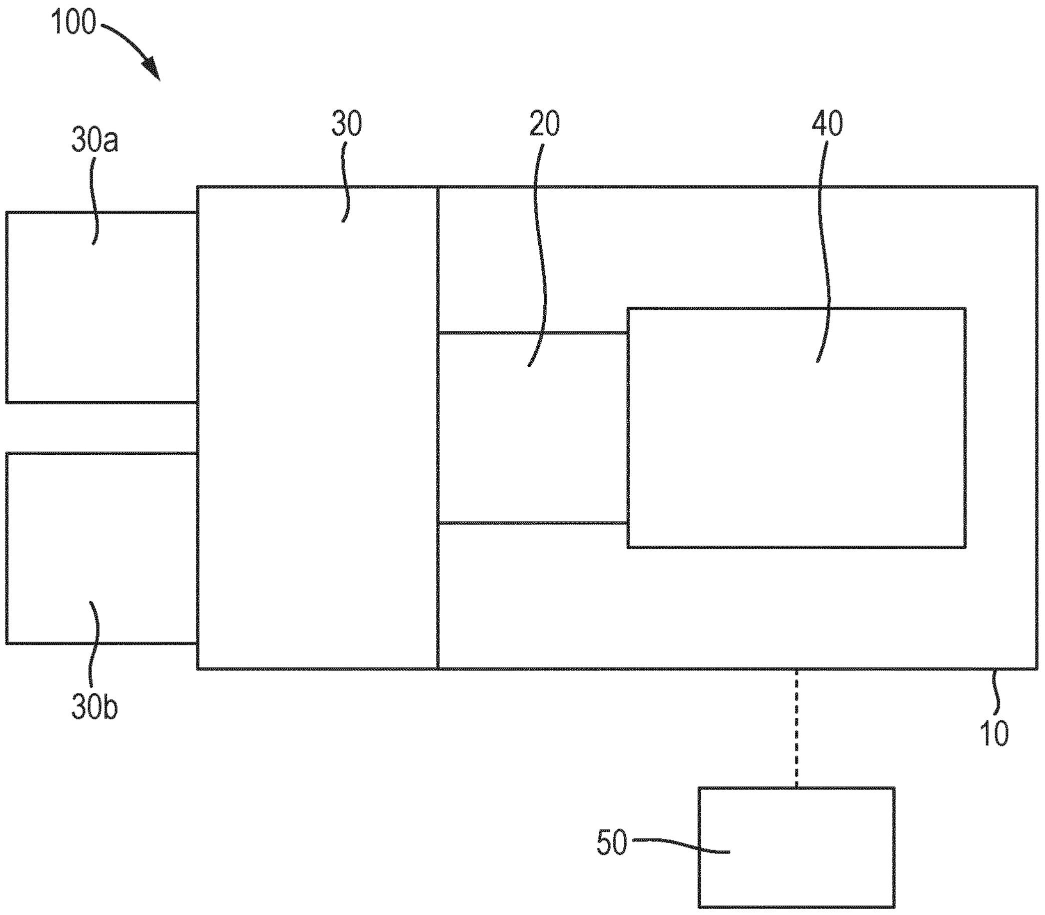
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. The sub-beams or beamlets may be arranged in the multi-beam, so the multi-beam may be referred to as having a multi-beam arrangement. The multi-beam arrangement may have a repeating pattern which may be rectilinear, for example rectangular or square, or hexagonal, for example regular hexagonal. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
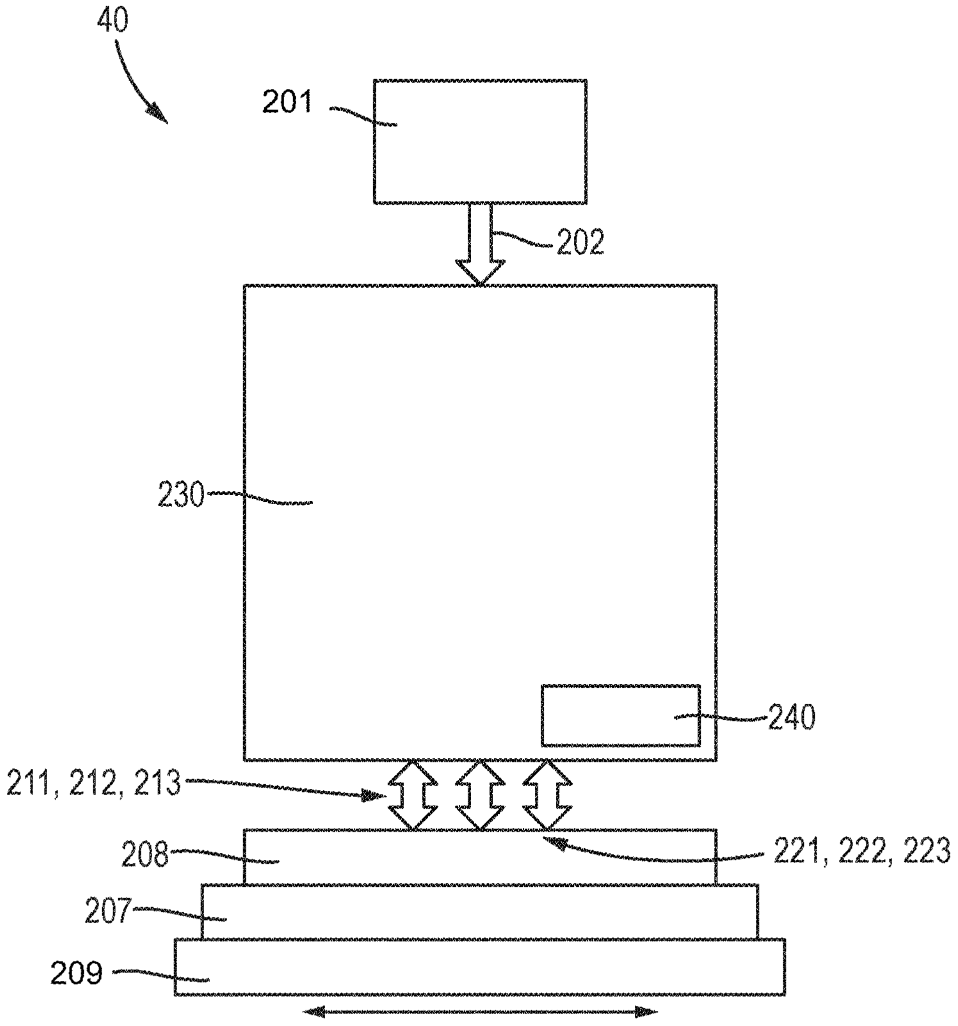
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. Multi-beam electron beam tool 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

Controller 50 may be connected to various parts of charged particle beam inspection apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy ≤50 eV and backscattered electrons typically have electron energy between 50 eV and the landing energy of primary sub-beams 211, 212, and 213.

Electron detection device 240 is configured to detect secondary electrons and/or backscattered electrons and to generate corresponding signals which are sent to controller 50 or a signal processing system (not shown), e.g. to construct images of the corresponding scanned areas of sample 208. Electron detection device may be incorporated into the projection apparatus or may be separate therefrom, with a secondary optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Figure 3:
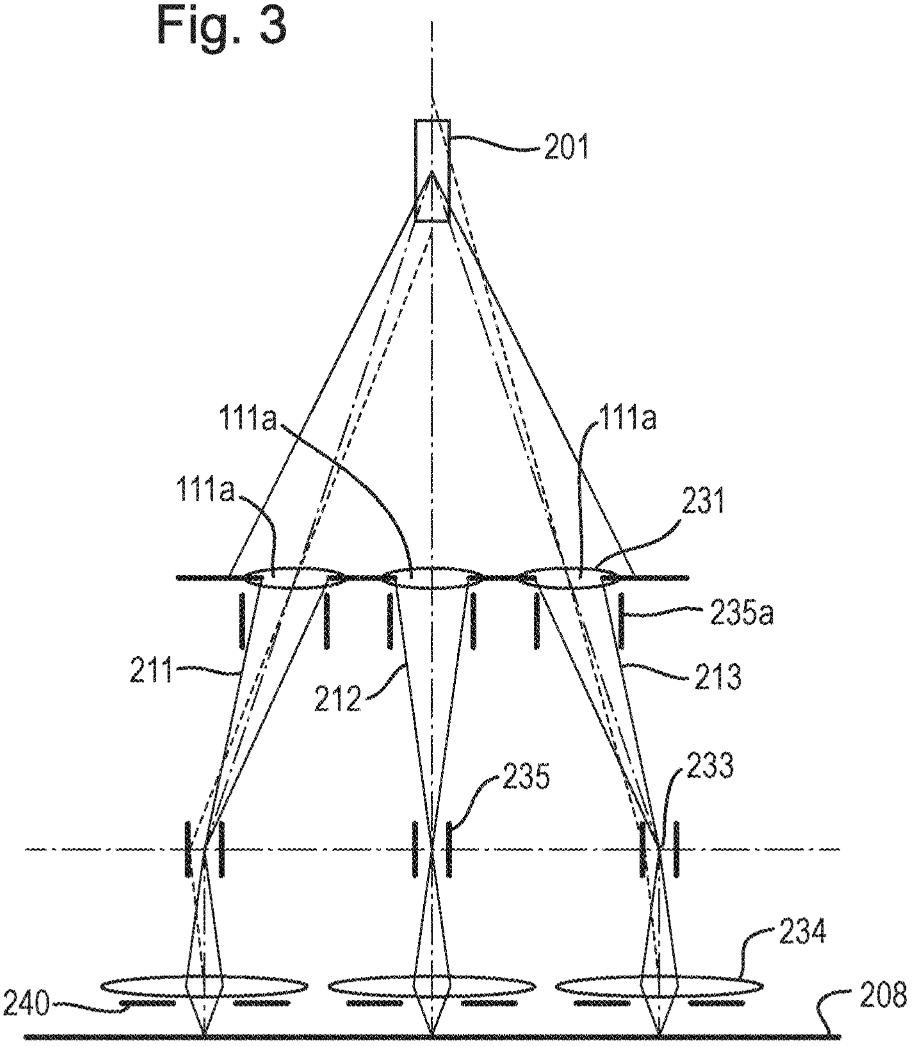
FIG. 3 is a schematic diagram of exemplary multi-beam apparatus according to an embodiment.

FIG. 3 is a schematic diagram of an assessment tool. Electron source 201 directs electrons toward an array of condenser lenses 231 forming part of projection system 230. The electron source is desirably a high brightness thermal field emitter with a good compromise between brightness and total emission current. There may be many tens, many hundreds or many thousands of condenser lenses 231. Condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The lens array may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the condenser lens array is formed of three plate arrays in which charged particles have the same energy as they enter and leave each lens, which arrangement may be referred to as an Einzel lens. The beam energy is the same on entering as leaving the Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

Each condenser lens in the array directs electrons into a respective sub-beam 211, 212, 213 which is focused at a respective intermediate focus 233. At the intermediate focuses 233 are deflectors 235. Deflectors 235 are configured to bend a respective beamlet 211, 212, 213 by an amount effective to ensure that the principal ray (which may also be referred to as the beam axis) is incident on the sample 208 substantially normally (i.e. at substantially 900 to the nominal surface of the sample). Deflectors 235 may also be referred to as collimators. Down beam of the intermediate focuses 233 are a plurality of objective lenses 234, each of which directs a respective sub-beam 211, 212, 213 onto the sample 208. Objective lenses 234 can be configured to de-magnify the electron beam by a factor greater than 10, desirably in the range of 50 to 100 or more.

An electron detection device 240 is provided between the objective lenses 234 and the sample 208 to detect secondary and/or backscattered electrons emitted from the sample 208. An exemplary construction of the electron detection system is described below.

The system of FIG. 3 can be configured to control the landing energy of the electrons on the sample. The landing energy can be selected to increase emission and detection of secondary electrons dependent on the nature of the sample being assessed. A controller provided to control the objective lenses 234 may be configured to control the landing energy to any desired value within a predetermined range or to a desired one of a plurality of predetermined values. In an embodiment, the landing energy can be controlled to desired value in the range of from 1000 eV to 5000 eV. Details of electrode structures and potentials that can be used to control landing energy are disclosed in EPA 20158804.3, which document is incorporated herein by reference.

In some embodiments, the charged particle assessment tool further comprises one or more aberration correctors that reduce one or more aberrations in the sub-beams. In an embodiment, each of at least a subset of the aberration correctors is positioned in, or directly adjacent to, a respective one of the intermediate foci (e.g. in or adjacent to the intermediate image plane). The sub-beams have a smallest sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In an embodiment, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses 231 are vertically close or coincident with the beam apertures. A challenge with positioning correctors at or near the condenser lenses 231, however, is that the sub-beams each have relatively large sectional areas and relatively small pitch at this location, relative to locations further downbeam.

In some embodiments, each of at least a subset of the aberration correctors is integrated with, or directly adjacent to, one or more of the objective lenses 234. In an embodiment, these aberration correctors reduce one or more of the following: field curvature; focus error; and astigmatism. Additionally or alternatively, one or more scanning deflectors (not shown) may be integrated with, or directly adjacent to, one or more of the objective lenses 234 for scanning the sub-beams 211, 212,214 over the sample 208. In an embodiment, the scanning deflectors described in US 2010/0276606, which document is hereby incorporated by reference in its entirety, may be used.

The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In an embodiment the objective lens referred to in earlier embodiments is an array objective lens. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is an two electrode decelerating lens. The bottom electrode of the objective lens is a CMOS chip detector integrated into a multi-beam manipulator array. Integration of a detector array into the objective lens replaces a secondary column. The CMOS chip is preferably orientated to face the sample (because of the small distance (e.g. 100 μm) between wafer and bottom of the electron-optical system). In an embodiment, electrodes to capture the secondary electron signals are formed in the top metal layer of the CMOS device. The electrodes can be formed in other layers. Power and control signals of the CMOS may be connected to the CMOS by through-silicon vias. For robustness, preferably the bottom electrode consist of two elements: the CMOS chip and a passive Si plate with holes. The plate shields the CMOS from high E-fields.

In order to maximize the detection efficiency it is desirable to make the electrode surface as large as possible, so that substantially all the area of the array objective lens (excepting the apertures) is occupied by electrodes and each electrode has a diameter substantially equal to the array pitch. In an embodiment the outer shape of the electrode is a circle, but this can be made a square to maximize the detection area. Also the diameter of the through-substrate hole can be minimized. Typical size of the electron beam is in the order of 5 to 15 micron.

In an embodiment, a single electrode surrounds each aperture. In another embodiment, a plurality of electrode elements are provided around each aperture. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller. Especially in case a larger electrode gives only a slightly larger detection efficiency, but a significantly larger crosstalk.

The back-scattered and/or secondary electron current collected by electrode is amplified by a Trans Impedance Amplifier.

Figure 5:
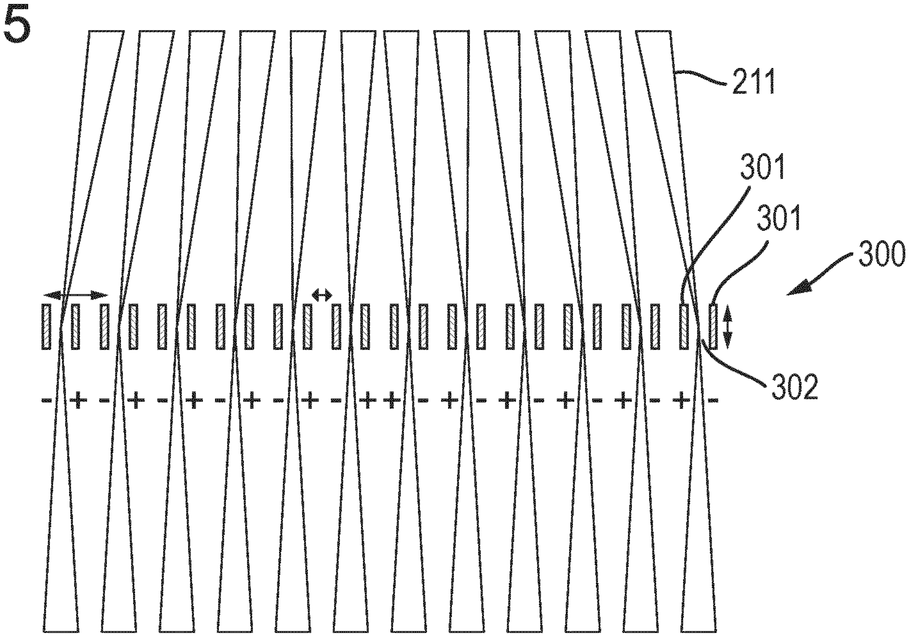
FIG. 5 is a schematic side view of an array of correctors.
Figure 6:
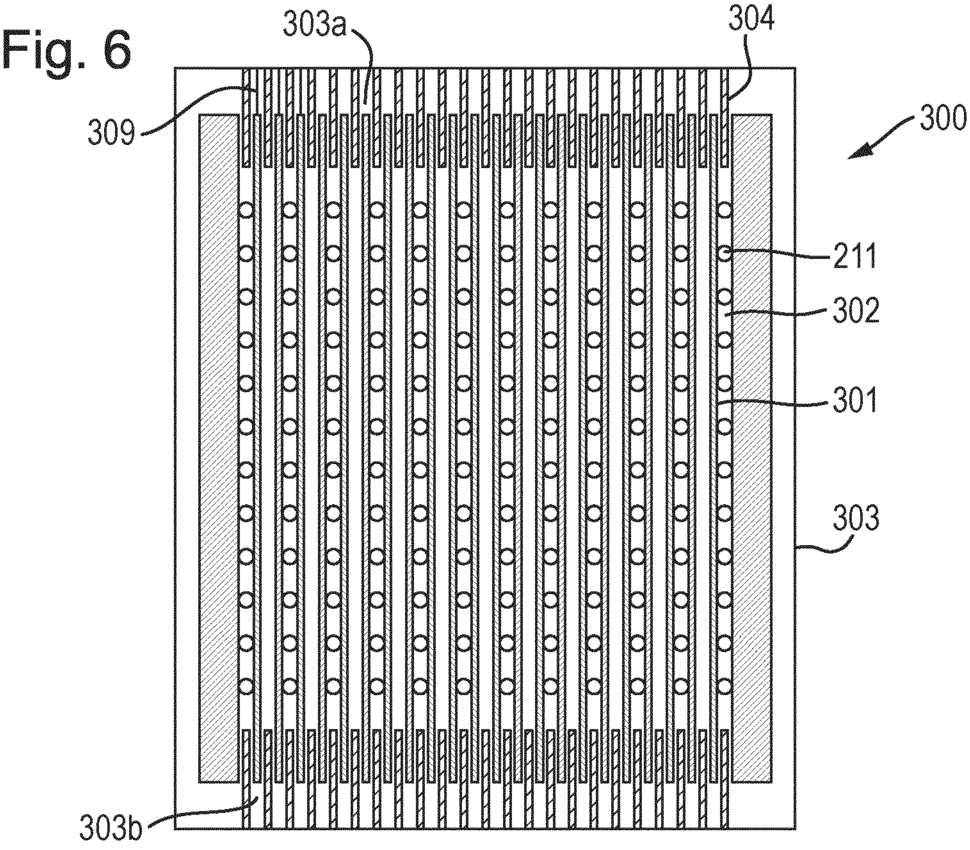
FIG. 6 is a schematic plan view of an array of correctors.

In an embodiment of the invention, the correctors at the intermediate focuses 233 are embodied by a slit deflector 300. Slit deflector 300 is an example of a manipulator and may also be referred to as a slit corrector. In arrangement the slit deflector may comprise part of a collimator array (for example as a deflector array 235 as described elsewhere herein) or adjoin a collimator array, or a part of such a collimator, as a corrector in the beam path, for example adjacently. As shown in FIGS. 5 and 6, slit deflector 300 comprises a set of elongate electrodes 301, e.g. parallel plates or parallel strips, defining a set of slits 302. The elongate electrodes may be electrostatic. The array of elongate electrodes may have one or more electrical connection, for example to each electrode. A potential difference may be applied to the electrodes, for example each electrodes. The applied potential may be similar for alternating electrodes or at least alternating polarity. The set or array of elongate electrodes 301 may be in a common plane. The common plane of the array of elongate electrodes 301 may be orthogonal to the beam path, for example of the multi-beam arrangement. The elongate electrodes may have planar surfaces, preferably directly facing the sub-beam paths. The planar surfaces of the electrodes may be mutually parallel. The electrodes may be equidistantly spaced relative to each other and for example relative to the sub-beams of the multi-beam arrangement, as depicted. The electrodes may be orthogonal to the sub-beam paths of the multi-beam arrangement, for example when collimated. The planar surfaces of the electrodes may be substantially aligned with the paths of the sub-beams of the multi-beam arrangement, for example when collimated. Electrodes 301 may be formed of silicon or a metal, for example doped silicon regions of a substrate and metallization layers formed on a substrate. Silicon electrodes can be formed by selective etching of a silicon wafer.

FIG. 6 shows an arrangement for mounting electrodes to form an array of elongate electrodes. A frame 303, e.g. of ceramic such as glass, is provided to support the electrodes. Shields 304, e.g. of ceramic such as glass, can be provided at the ends of the electrodes to prevent surface creep or breakdown when high-voltages are provided to the electrodes. As depicted, electrodes 300 extend across the frame 303, for example between facing sides of the frame. The electrodes may extend between all the sub-beam paths across a multi-beam arrangement of sub-beam 211, for example as a line of sub-beam paths, such as depicted. Electric potentials are provided to the electrodes through conductive traces 309 (for clarity only a few are shown in the figure). The shields 304 protrude from sides 303*a*, 303*b* of the frame 303 to which the electrodes of the array are mounted. The shields interpose between adjacent electrodes suppressing high voltage discharge between adjacent electrodes by increasing the creep length between adjacent electrodes.

Slit deflectors 300 functioning as aberration correctors 235*a* may alternatively or in addition be positioned just below the condenser lenses 231. This can be advantageous in that any angular error to be corrected will not have been translated into a large positional shift. The aberration correctors 235*a* may correct aberrations that prevent a proper column alignment. Such aberrations may also lead to a misalignment between the sub-beams 211, 212, 213 and the correctors 235*a*. For this reason, it may be desirable to additionally or alternatively position aberration correctors 235*a* at or near the condenser lenses 231 (e.g. with each such aberration corrector 235*a* being integrated with, or directly adjacent to, one or more of the condenser lenses 231). This is desirable because at or near the condenser lenses 231 aberrations will not yet have led to a shift of corresponding sub-beams 211, 212, 213 because the condenser lenses 231 are vertically close or coincident with the beam apertures 111*a*. A challenge with positioning correctors 235*a* at or near the condenser lenses 231 however, is that the sub-beams 211, 212, 213 each have relatively large cross-sectional areas and relatively small pitch at this location, relative to locations further downstream.

A line of sub-beam paths, for example for the sub-beams in operation of the tool, interposes a pair of elongate electrodes, that may take the form of an array of strips, so that a potential difference between the electrodes causes a deflection of the sub-beams. The direction of the deflection is determined by the relative polarity of the potential difference in a direction relative to the optical axis. The magnitude of the deflection is determined by the magnitude of the potential difference, the distance between the electrodes and the width of the electrodes in the direction parallel to the propagation of the sub-beams. These dimensions may be referred to as the width and depth of the slit, respectively. In an embodiment the width of the slits is in the range of from 10 to 100 μm, desirably 50 μm. In an embodiment the pitch of the slits is in the range of from 50 to 200 μm, desirably 100 m. In an embodiment, the depth of the slit is in the range of from 50 to 200 μm.

In an embodiment, the electrodes are at the same potential along their lengths and the slit is of constant width or depth so that all sub-beams passing through a given slit experience substantially the same deflection as they all have substantially the same energy.

In an embodiment, the slit may have a non-constant cross-section, e.g. a variation in width or depth, to provide a predetermined variation in the deflection in the sub-beams according to their position along the length of the slit.

In an embodiment, the elongate electrodes define a set of parallel slits such that each of the sub-beams pass through a slit. The surface of each electrode that in part defines a slit may have a planar surface that may be parallel with a sub-beam path. Thus, facing elongate surfaces of the respective elongate electrodes define a corresponding slit. The facing surfaces of a slit may each be planar and mutually parallel. The slit may extend across the array of sub-beam paths, for example across the multi-beam arrangement, for example as depicted in FIG. 6 in reference to FIG. 5. Desirably the potentials applied to each electrode surface are individually controllable so that the deflection can be controlled as a function of beam position in a direction perpendicular to the longitudinal direction of the slits. In an embodiment a predetermined set of voltages are applied to the electrodes to provide a predetermined set of deflections. For example if the slits extend in along a Y axis of a Cartesian coordinate system (i.e. the elongate direction of the electrodes is in a Y direction), deflection can be controlled as a function of sub-beam position in an X direction.

Figure 8:
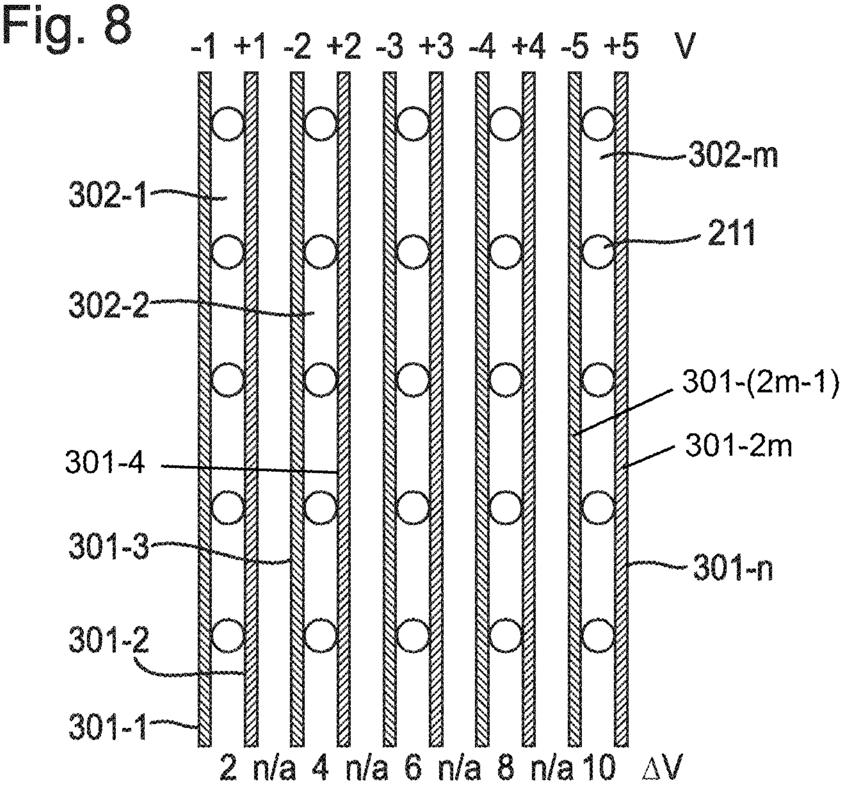
FIG. 8 is a diagram explaining applied voltages in an array of correctors.

In an embodiment, each slit is defined by two dedicated electrodes. For example, as shown in FIG. 8, slit 302-1 is defined by opposing surfaces of the electrodes 301-1 and 301-2, slit 302-2 is defined by opposing surfaces of electrodes 301-3 and 301-4, etc. so that slit 302 is defined by electrodes 301-(2m−1) and 301 2m, wherein m is an integer variable. Opposite potentials are applied to alternate electrodes, for example odd-numbered electrodes are negative and even numbered electrodes are positive. The magnitudes of the applied potentials can be varied with position so as to provide a desired deflection that varies with position in the direction perpendicular to the length of the electrodes. For example, as shown in FIG. 8, the potential (indicated at the top of the figure) increases linearly and the potential differences (indicated at the bottom of the figure) likewise increase linearly. For example, one set of electrodes, e.g. the even ones, can be kept at a constant potential, e.g. ground.

Figure 9:
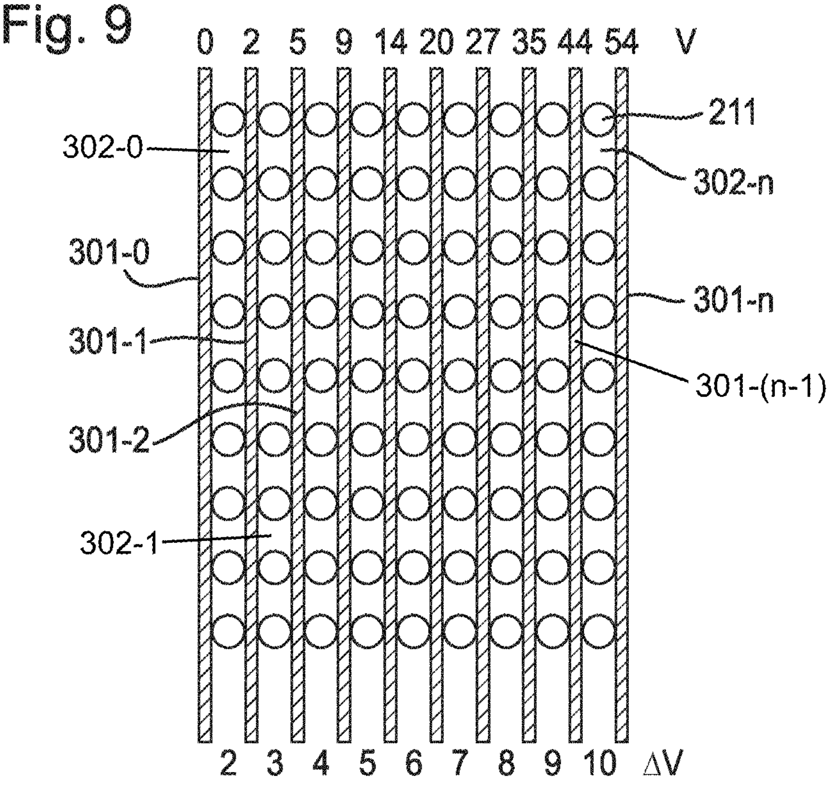
FIG. 9 is a diagram explaining another arrangement of applied voltages in an array of correctors

In an alternate embodiment, each electrode (except for the electrodes at the end of the array) serves to define one side of each of two slits. That is, in general, the opposite surfaces of the electrodes extending in the direction of the beam paths define in part adjoining slits. For example, as shown in FIG. 9, slit 302-1 is defined by the surfaces of electrodes 301-0 and 301-1, slit 302-2 is defined by facing surface of electrodes 301-1 and 301-2, etc., so that slit 302-*n* is defined by the surface of electrodes 301-(*n*−1) and 301-*n*, wherein n is an integer variable. In such an arrangement, the potential applied to electrode 301-*n* relative to the potential applied to electrode 301-0 is the sum of the potential differences applied across slits 302-1 to 302-*n*. A linear increase in potential differences therefore results in the absolute potentials applied to the electrodes increasing more quickly than linear. In general, in an arrangement as shown in FIG. 9 the potential differences increase monotonically across the array.

An advantage of the arrangement of FIG. 8, compared to that of FIG. 9, is that the magnitudes of the potentials applied to the electrodes need be no greater than the potential differences required to achieve the desired deflections. An advantage of the arrangement of FIG. 9, compared to that of FIG. 8, is that fewer electrodes are required so that the corrector can be made more compact. The arrangement of FIG. 9 is advantageous if the corrector is positioned close to condenser lenses 231 because the sub-beams are closer together and the arrangement of FIG. 9 can be made with a small distance between slits.

In an embodiment, a plurality of slit deflectors are provided adjacently in the beam propagation direction. Such an arrangement may be referred to as a stack of slit deflectors. The slit deflectors in a stack are differently oriented.

In an embodiment, the sub-beams are arranged in a rectangular array and two slit deflectors are provided with the slits of a first slit deflector being oriented perpendicularly to the slits of the second slit deflector. For example the first slit deflector has slits extending in the Y direction and provides a deflection in the X direction controllable as a function of sub-beam position in the X direction. The second slit deflector has slits extending in the X direction and provides a deflection in the Y direction controllable as a function of sub-beam position in the Y direction. The slit deflectors may be provided in any order in the stack. Further details of a slit deflector may be found in EPA20156253.5, in which the description of a multi-beam deflector apparatus is hereby incorporated by reference.

In an embodiment, the sub-beams are arranged in a hexagonal array and two slit deflectors are provided. The slits of the first slit deflector are orthogonal to the slits of the second slit detector. For example the first slit deflector has slits extending in the Y direction and provides a deflection in the X direction controllable as a function of sub-beam position in the X direction. The second slit deflector has slits extending in the X direction and provides a deflection in the Y direction controllable as a function of sub-beam position in the Y direction. The second slit detector has a smaller pitch than the first slit detector and fewer sub-beams per slit than the first slit detector. The slit deflectors may be provided in any order in the stack.

Figure 7:
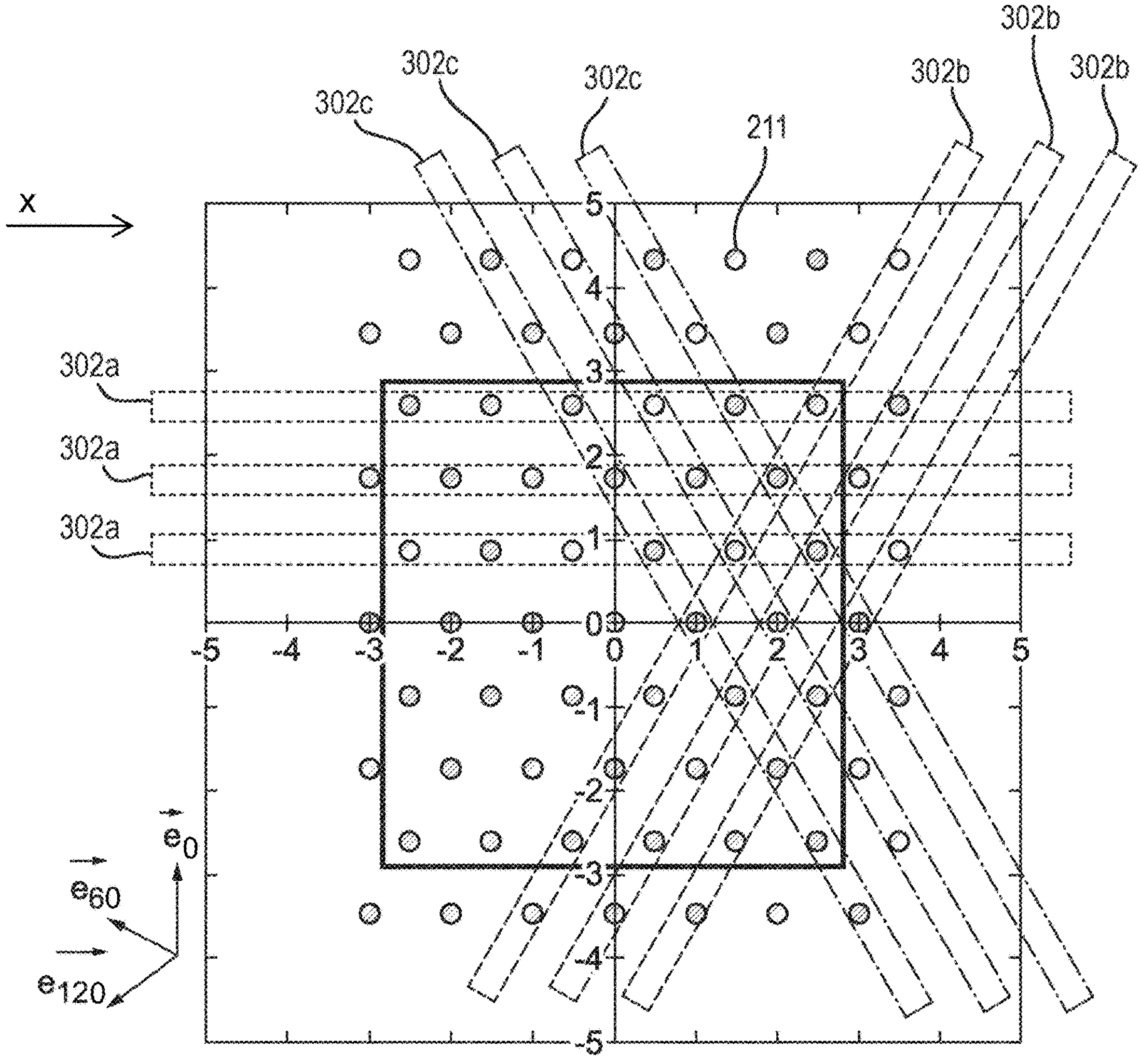
FIG. 7 is a schematic plan view of a hexagonal array of correctors.

In an embodiment, the sub-beams are arranged in a hexagonal array and three slit deflectors in a stack are provided. The three slit deflectors are arranged such that there is a 60° angle between slits of the different slit detectors. For example as shown in FIG. 7, a first slit deflector may have slits 302*a* oriented parallel to the X axis (0°), a second slit deflector may have slits 302*b* at +60° to the X axis and a third slit deflector may have slits 302*c* at −60° to the X axis. The slit deflectors may be provided in any order in the stack. By suitable application of potentials to the electrodes defining the slits 302*a*, 302*b*, 302*c*, a desired deflection in any direction can be achieved as disclosed in EPA20156253.5. Of that document the disclosure of a hexagonal array of three slit deflectors is hereby incorporated by reference. In an arrangement, although a regular hexagonal array has been described, the same type of corrector may be achieved in an irregular array in which a deflector slit is arranged to correspond with the three axes of the irregular hexagonal array.

Using an arrangement such as shown in FIG. 7, the following corrections can be realized:

$$\Delta\alpha_0 := f_0\left(\vec{r}\cdot\overrightarrow{e_0}\right) \tag{1}$$

$$\Delta\alpha_{60} := f_{60}\left(\vec{r}\cdot\overrightarrow{e_{60}}\right) \tag{2}$$

$$\Delta\alpha_{120} := f_{120}\left(\vec{r}\cdot\overrightarrow{e_{120}}\right) \tag{3}$$

In other words:

Any deflection in the 0 degree direction that is a function of position in the 0 degree direction Any deflection in the 60 degree direction that is a function of position in the 60 degree direction Any deflection in the 120 degree direction that is function of position in the 120 degree direction, wherein α represents the deflection in the given direction (0 degrees, 60 degrees or 120 degrees), f represents a function in the given direction (0 degrees, 60 degrees or 120 degrees), r represents the position vector, and e represents the unit vector in the given angle (0 degrees, 60 degrees or 120 degrees)

Figure 10:
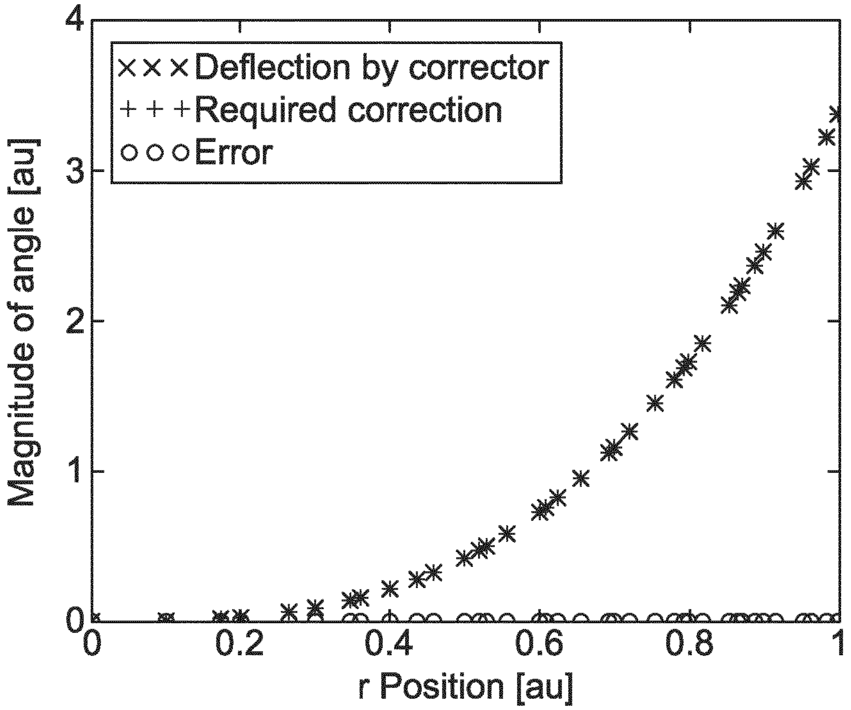
FIGS. 10 and 11 graphs of correction with respect to position.
Figure 11:
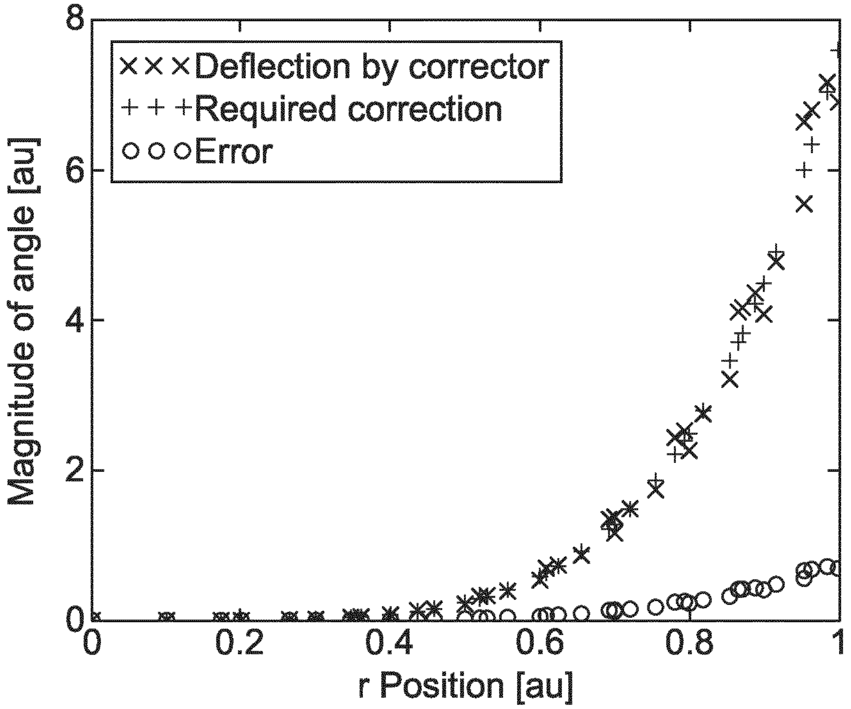

FIGS. 10 and 11 demonstrate that for example the following macro-aberrations can be corrected using these degrees of freedom:

1st order (lens effect): perfect correction

3rd order: perfect correction

5th order: 10× reduction

FIG. 10 depicts the angular deflection (in arbitrary units) required for and achievable for a $3^{rd}$ order correction as a function of position r in arbitrary units. FIG. 11 depicts the angular deflection (in arbitrary units) required for and achievable for a $5^{th}$ order correction as a function of position r in arbitrary units.

An additional advantage of using three slit deflector arrays (0, 60, 120 degree) over two slit deflector arrays (0, 90 degree) is that for 1st order effect (perfect lens) each array has to deflect only ⅔ of the angle compared to the case with two slit deflectors.

Other arrangements of multiple slit deflectors may be provided for other arrangements of sub-beams. For example the slits might be arranged as concentric hexagons.

In an embodiment of the invention, multiple beams pass through a slit defined by a pair of electrodes. This substantially reduces the number of connections required to provide the deflection potentials. In a multi-beam tool with many hundreds or thousands of beams, it is difficult, if not impossible, to provide independent deflection potentials for each sub-beam since there is limited space for wiring or circuit traces (routing). This problem is addressed by the present invention since the number of traces required is significantly reduced. In some cases, an embodiment of the invention may not be capable of completely correcting an aberration, for example a 3rd order rotationally symmetric aberration. However, an embodiment of the invention can effect a significant and useful reduction even in aberrations that cannot be completely corrected.

Figure 4:
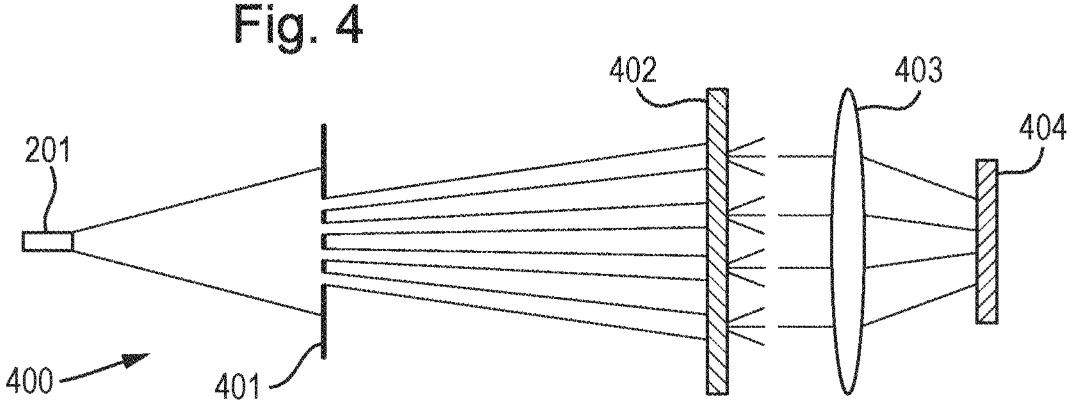
FIG. 4 is a schematic diagram of device for detecting aberrations.

An error that can be corrected for by an embodiment of the invention occurs if the virtual source position of the electron source 201 is not constant for all emission angles. This effect is known as source grid errors. FIG. 4 depicts a device 400 for measuring source grid errors. Source 201 is set up to emit electrons towards an aperture array 401. This may be the aperture array from the condenser lens array of an projection system. Aperture array 401 has a known arrangement of apertures and divides the electrons emitted by source 201 into a plurality of sub-beams. A fluorescent screen 402 is provided at a known position in the path of the sub-beams. Fluorescent screen 402 emits light, e.g. visible light, in response to incident electron. A projection lens 403 projects an image of fluorescent screen 402 onto imaging device 404, e.g. a CCD. The image captured by imaging device 404 allows for easy determination of source grid errors since in the absence of source grid errors the pattern of bright spots expected is directly predictable from the arrangement of apertures in aperture array 401. This arrangement can be used to measure source position errors in situ in a tool.

A slit deflector as described above may introduce a slight focusing effect in the direction that the beam is deflected. If two or more differently oriented slit deflector arrays are used there will be a focusing affect in two or more directions. The magnitude of this focusing effect is proportional to the magnitude of the deflection. In some cases, this focusing effect may be undesirable.

Figure 12:
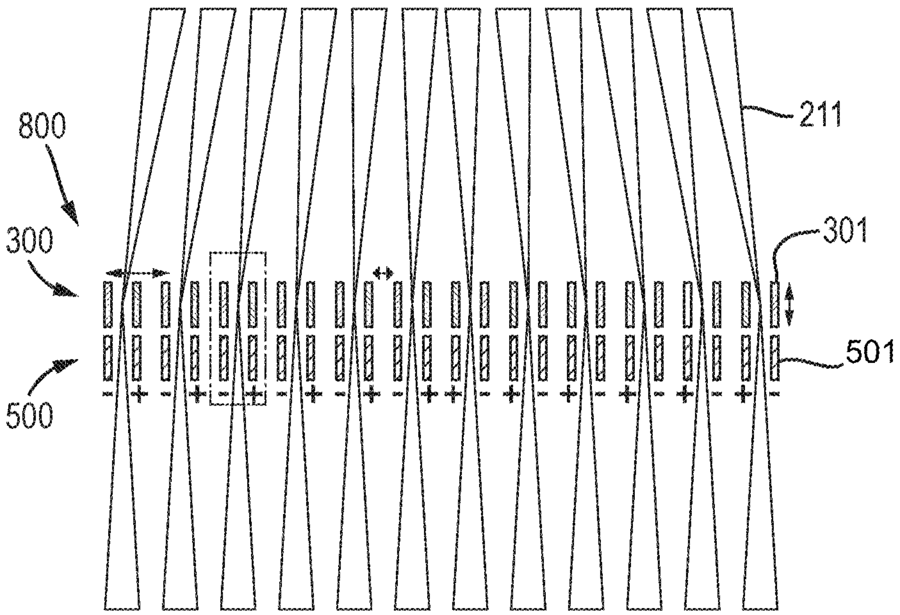
FIG. 12 is a schematic side view of a two-layer corrector array.
Figure 13:
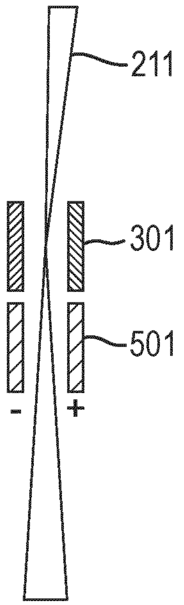
FIG. 13 is a schematic side view of a two-layer corrector.
Figure 14:
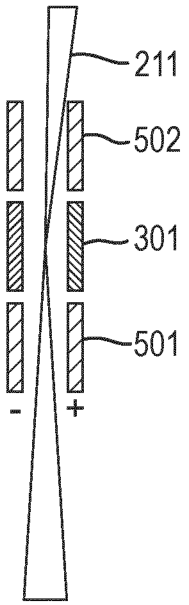
FIG. 14 is a schematic side view of a three-layer corrector.

To compensate for the focusing effect of a slit deflector, a slit lens may be added. As shown in FIGS. 12-14, a slit lens 800 comprising an array 300 of elongate electrodes 301 (which define a first array of elongate slits) and at least a further array 500 of corresponding elongate electrodes 501 (depicted as 305) (which define a second array of elongate features, for example slits). The further array 500 of elongate electrodes 501 is displaced along the respective beam paths for example up beam or down beam with respect to the array 300 of elongate electrodes 301; in the arrangement depicted in FIG. 12 the further array is down beam of the array 300 of elongate electrodes. The elongate electrodes 501 of the further array 500 may be aligned, preferably parallel with corresponding elongate electrodes 301 of the array 300. Each array of elongate electrodes is formed with a structure with a similar shape to that of the slit deflectors referred to earlier in this description. The lens is made by having a potential difference between the average of the two deflector electrodes and the two slit electrodes. This is done by either changing the potential of the slit electrodes or by adding a voltage offset to the deflector electrodes. The elongate electrodes 301 may be set at respective potentials, and the corresponding elongate electrodes 501 may be set at a ground potential or at respective different potentials. The strength of each slit lens can be selected such that it makes the astigmatism equal to the astigmatism of the slit deflector with the largest deflection. In an embodiment where the corrector consists of a deflector and a slit lens arrays for each axis (normally two, one for each of X and Y), the resulting astigmatism has the characteristics of a micro lens array.

FIG. 13 is an enlarged view showing one pair of deflector electrodes 301 and one pair of slit lens electrodes 501. The slit deflector electrodes and slit lens electrodes can be in either order. As shown in FIG. 14, it is also possible to use two pairs of slit lens electrodes 501, 502, for example one either side of the slit deflector electrodes, for example with an additional array of elongate electrodes 502 up beam of the array 300 of elongate electrodes and the further array 500 of elongate electrodes 501. In the arrangement of FIG. 14, the slit lens electrodes 501, 502 can be held at the same potential, e.g. ground or an elevated potential, with the potentials of the slit deflector controlled to have the desired overall deflection and focusing effect. In this case, the three-lens structure is similar to an Einzel lens. Both the further array 500 and additional array may be up beam or down beam of the array 300 of elongate electrodes 301, but this may be less preferable than having the additional and further arrays either side in which arrangement; for example, the arrays may be used as an array of Einzel lenses.

Figure 15:
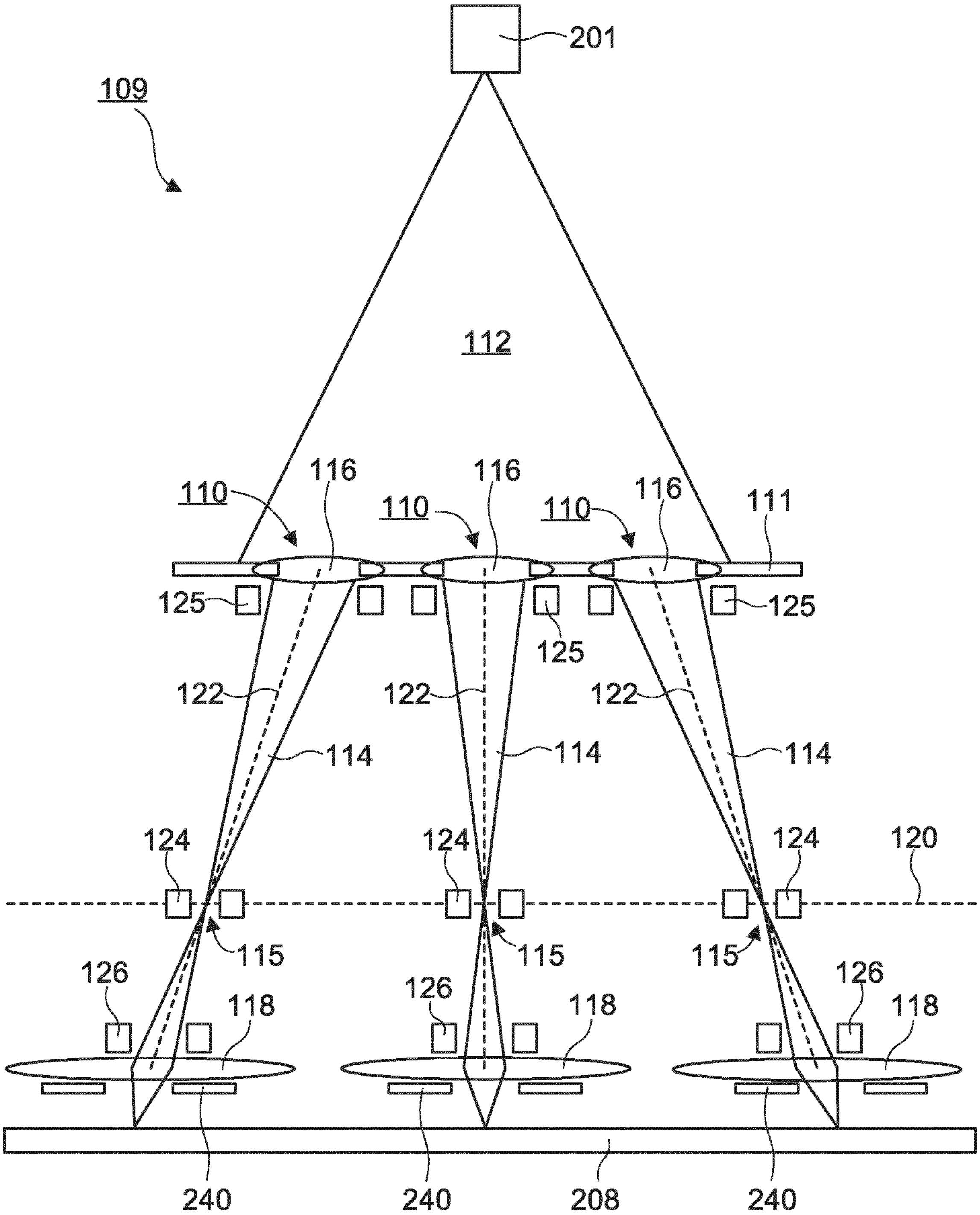
FIG. 15 is a schematic diagram of exemplary multi-beam apparatus according to an embodiment.

Another embodiment of a charged particle assessment tool 109 is illustrated schematically in FIG. 15. This embodiment further comprises one or more aberration correctors 124, 125, 126 that reduce one or more aberrations in the sub-beams 114, each sub-beam having a respective axis 122. In an embodiment, each of at least a subset of the aberration correctors 124 is positioned in, or directly adjacent to, a respective one of the intermediate foci 115 (e.g. in or adjacent to the intermediate image plane 120). The sub-beams 114 have a smallest cross-sectional area in or near a focal plane such as the intermediate plane 120. This provides more space for aberration correctors 124 than is available elsewhere, i.e. upbeam or downbeam of the intermediate plane 120 (or than would be available in alternative arrangements that do not have an intermediate image plane 120).

In an embodiment, aberration correctors 124 positioned in, or directly adjacent to, the intermediate foci 115 (or intermediate image plane 120) comprise deflectors to correct for the source 201 appearing to be at different positions for different sub-beams 114 derived from beam 112 emitted from source 201. Correctors 124 can be used to correct macroscopic aberrations resulting from the source 201 that prevent a good alignment between each sub-beam 114 and a corresponding objective lens 118.

The aberration correctors 124 may correct aberrations that prevent a proper column alignment. Such aberrations may also lead to a misalignment between the sub-beams 114 and the correctors 124. For this reason, it may be desirable to additionally or alternatively position aberration correctors 125 at or near the condenser lenses 116 (e.g. with each such aberration corrector 125 being integrated with, or directly adjacent to, one or more of the condenser lenses 116). This is desirable because at or near the condenser lenses 116 aberrations will not yet have led to a shift of corresponding sub-beams 114 because the condenser lenses 116 are vertically close or coincident with the beam apertures 110. A challenge with positioning correctors 125 at or near the condenser lenses 116, however, is that the sub-beams 114 each have relatively large cross-sectional areas and relatively small pitch at this location, relative to locations further downstream.

In some embodiments, as exemplified in FIG. 15, each of at least a subset of the aberration correctors 126 is integrated with, or directly adjacent to, one or more of the objective lenses 118. In an embodiment, these aberration correctors 126 reduce one or more of the following: field curvature; focus error; and astigmatism.

In the apparatus of FIG. 15, any or all of the correctors 124, 125, 126 can be slit deflectors as described above.

Figure 16:
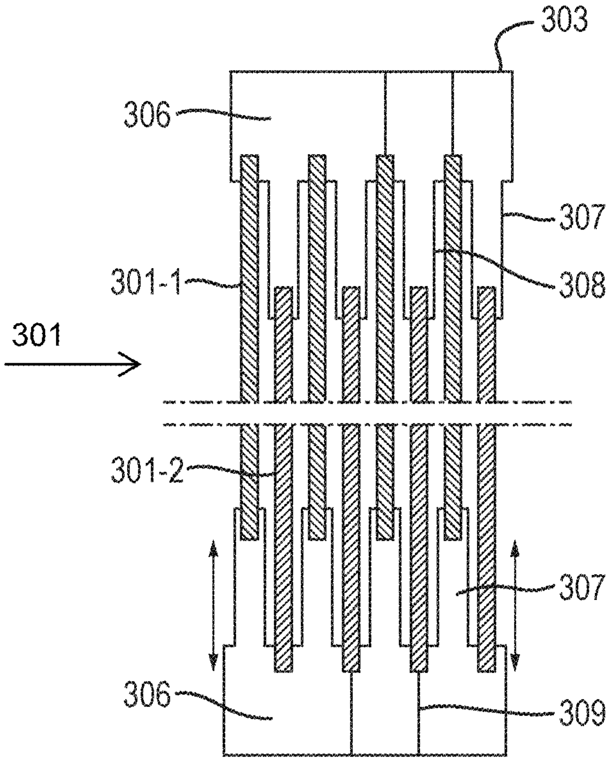
FIG. 16 is a schematic plan view of an arrangement for mounting electrodes.

FIG. 16 depicts an alternative arrangement for mounting electrodes to form an array of elongate electrodes for a slit deflector or slit lens. Frame 303 is provided with two sets of fingers 307 projecting inwardly from base portions 306 opposite sides of the frame. That is, opposite sides of the frame to which the electrodes 301 are mounted have a set of fingers 307. The fingers may be integral with the frame. Relative to an end of adjoining fingers, the intervening base portions may be considered to be recessed, e.g. providing a recess surface 308. The fingers and recesses alternate along a side of the frame to which the electrodes 301-1, 301-2, etc. are mounted. Each electrode is mounted at one end to a finger 307 and at the other to the base portion 306, e.g. at a recess. The electrodes are connected to the frame alternately at a recess and to a finger. One of adjacent electrodes is connected to one side of frame via finger and the other via a recess. The electrodes on the opposing side of the frame may be connected differently, so that each electrode is connected to the frame via a finger and a recess. For example, odd numbered electrodes 301-1, etc. may be mounted to fingers at a first side of the frame (lower side in the drawing) and even numbered electrodes 301-2, etc. are mounted to fingers at the second side of the frame (upper side in the drawing).

The electrodes may be electrically connected via their mounting to a recess. In another arrangement the electrodes are electrically connected to a finger although this may be less preferred. Since alternate electrodes are connected at a recess or a finger, similar potential differences may be applied to alternate electrodes. Electric potentials are provided to the electrodes through conductive traces 309 (for clarity only a few are shown in the figure) connected to the electrodes at the base portions, or recesses. The creep length, i.e. the length of the surface over which a creep discharge could occur, is the lateral distance along the recess and an end of the finger and the length of the finger. The creep length is the lateral distance over the surface of the frame, from the connection of an electrode at the recess to the surface of the finger extending from the frame, the length of the side surface of the finger extending from the frame, and the distance at the end of the finger from the side surface of the finger to the connection of the finger to the adjoining electrode The creep length, for example between adjoining electrodes, is therefore increased by the length of a finger 307. Isolation between electrodes is therefore improved. The risk of high voltage discharge between electrodes at the frame is reduced.

The frame 303 and fingers 307 are formed from an insulator, preferably ceramic, preferably silicon oxide, preferably glass. In an embodiment, the frame is formed by selective etching of a substrate, e.g. a silicon wafer. Preferably the frame, or at least each side, is monolithic.

An assessment tool according to an embodiment of the invention may be a tool which makes a qualitative assessment of a sample (e.g. pass/fail), one which makes a quantitative measurement (e.g. the size of a feature) of a sample or one which generates an image of map of a sample. Examples of assessment tools are inspection tools (e.g. for identifying defects), review tools (e.g. for classifying defects) and metrology tools or tools capable of performing any combination of assessment functionalities associated with inspection tools, review tools, or metrology tools (e.g. metro-inspection tools). The one or more deflectors described herein may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements A multi-beam electron beam tool may comprise a primary projection apparatus, a motorized stage and a sample holder. The primary projection apparatus is an illumination apparatus comprised by the multi-beam electron beam tool. The primary projection apparatus may comprise one or more of at least any of the following components: an electron source, a gun aperture plate, a condenser lens, an aperture array, beam manipulators (that may comprise MEMS structures), an objective lens and a beam separator (e.g. a Wien filter). The sample holder is supported by the motorized stage. The sample holder is arranged to hold a sample (e.g., a substrate or a mask) for inspection.

The multi-beam electron beam tool may further comprise a secondary projection apparatus and an associated electron detection device. The electron detection device may comprise a plurality of electron detection elements.

The primary projection apparatus is arranged to illuminate a sample. In response to the incidence of primary sub-beams or probe spots on a sample, electrons are generated from the sample which include secondary electrons and backscattered electrons. The secondary electrons propagate in a plurality of secondary electron beams. The secondary electron beams typically comprise secondary electrons (having electron energy ≤50 eV) and may also comprise at least some of the backscattered electrons (having electron energy between 50 eV and the landing energy of primary sub-beams). A beam separator in the primary projection apparatus may be arranged to deflect the path of the secondary electron beams towards the secondary projection apparatus. The secondary projection apparatus subsequently focuses the path of secondary electron beams onto the plurality of elements of the electron detection device. The detection elements generate corresponding signals which may be sent to a controller or a signal processing system, e.g. to construct images of the corresponding scanned areas of sample.

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g. voltage supplies and or current supplies) to control the component to manipulate the charged particle beam in this manner. For example, a voltage supply may be electrically connected to one or more components to apply potentials to the components, such as in a non-limited list the, the objective lens array 234, the condenser lens 231, correctors 235*a*, and collimator array 235, under the control of the controller or control system or control unit. An actuatable component, such as a stage, may be controllable to actuate and thus move relative to another components such as the beam path using one or more controllers, control systems, or control units to control the actuation of the component.

The embodiments herein described may take the form of a series of aperture arrays or electron-optical elements arranged in arrays along a beam or a multi-beam path. Such electron-optical elements may be electrostatic. In an embodiment all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques).

The electron optical elements adjacent along the beam path may be structurally connected to each other for example with electrically isolating elements such as spacers. The Isolating elements may be made of an electrically insulating material such a ceramic such as glass.

References to upper and lower, up and down, above and below should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

Exemplary embodiments of the invention are described below in the following numbered paragraphs 1. A charged-particle tool comprising:
   - a condenser lens array configured to separate a beam of charged particles into a first plurality of sub-beams along a respective beam path and to focus each of the sub-beams to a respective intermediate focus;
   - an array of objective lenses, each configured to project one of the plurality of charged-particle beams onto a sample;
   - a corrector comprising an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams; and
   - an electric power supply configured to apply a potential difference between the pair of elongate electrodes so as to deflect the second plurality of sub-beams by a desired amount.

1a. A charged-particle tool comprising: a condenser lens array configured to separate a beam of charged particles into a first plurality of sub-beams along a respective beam path and to focus each of the sub-beams to a respective intermediate focus; an array of objective lenses, each configured to project one of the plurality of charged-particle beams onto a sample; a corrector comprising along the beam path a first array of elongate electrodes, and a second array of elongate electrodes, the second array of elongate electrodes being substantially parallel to the first array of elongate electrodes, the first array adjoining the second array along the beam path, the elongate electrodes of the first array extending substantially perpendicular to the beam paths of the first plurality of sub-beams and arranged such that a second plurality of the sub-beams propagate between a pair of the elongate electrodes of the first array of elongate electrodes, the second plurality of sub-beams being a subset of the first plurality of sub-beams, the elongate electrodes comprising parallel plates extending parallel to the direction of propagation of the second plurality of sub-beams; and an electric power supply configured to apply a potential difference between the pair of elongate electrodes of the first array so as to deflect the second plurality of sub-beams by a desired amount; preferably the elongate electrodes may have planar surfaces, more preferably directly facing the sub-beam paths; preferably the elongate electrodes are electrostatic.

2. A tool according to embodiment 1 or 1a wherein there are a plurality of pairs of elongate electrodes arranged such that a respective second plurality of sub-beams propagates between each pair of elongate electrodes; and the electric power source is configured to apply a respective potential difference between each pair of elongate electrodes; preferably the pairs of elongate electrodes extending either side of a line of the second plurality of sub beams, preferably the line extending across the multi-beam arrangement of the sub-beams; and/or preferably the pairs of elongate electrodes extending across the multi-beam arrangement of sub-beams.

3. A tool according to embodiment 2 wherein each of the elongate electrodes has sub-beams adjacent only one side thereof.

4. A tool according to embodiment 1, 1a or 2 wherein the electric power supply is configured to apply potentials of opposite polarities to adjacent elongate electrodes.

5. A tool according to embodiment 2 wherein some of the elongate electrodes has sub-beams adjacent both sides thereof, preferably both sides directly face sub-beam paths, preferably the sub-beam paths facing either side being from a different line of sub-beams, preferably across the multi-beam arrangement.

6. A tool according to embodiment 5 wherein the electric power source is configured such that the potential applied to each of the elongate electrodes is given by a continually, e.g. monotonically, increasing function of position across the array of elongate electrodes.

7. A tool according to any one of the preceding embodiments wherein the elongate electrodes comprise parallel plates extending parallel to the direction of propagation of the second plurality of sub-beams.

8. A tool according to any one of the preceding embodiments wherein the corrector comprises, along the beam path, a first set of elongate electrodes and a second set of elongate electrodes, the second set of elongate electrodes being perpendicular to the first set of elongate electrodes; or wherein the corrector comprises, along the beam path, an additional array of elongate electrodes, the additional array of elongate electrodes being perpendicular or parallel to the first array of elongate electrodes.

9. A tool according to any one of embodiments 1 to 7 wherein the corrector comprises a first set of elongate electrodes, a second set of elongate electrodes and a third set of elongate electrodes, the angle between the first set of elongate electrodes and the second set of elongate electrodes being 60° and the angle between the second set of elongate electrodes and the third set of elongate electrodes being 60°; or wherein the corrector comprises the first array of elongate electrodes comprises a first set of elongate electrodes, a second set of elongate electrodes and a third set of elongate electrodes, one of the first, second and third set of elongate electrodes corresponding to the elongate electrodes of the first array, the angle between the first set of elongate electrodes and the second set of elongate electrodes being 60° and the angle between the second set of elongate electrodes and the third set of elongate electrodes being 60°.

10. A tool according to any one of the preceding embodiments wherein the corrector is arranged so that the intermediate focuses are between the elongate electrodes, preferably of the first array.

11. A tool according to any one of embodiments 1 to 9 wherein the corrector is arrange adjacent the condenser lens array and/or adjacent to or integrated in the objective lens array.

11a. A tool according to any of the preceding embodiments wherein the corrector is configured to reduce at least one of: field curvature; focus error; and astigmatism.

12. A tool according to any one of the preceding embodiments wherein the corrector is configured to correct for a macro-aberration of the first plurality of sub-beams.

12a. A tool according to any one of embodiments 1 to 12, further comprising an additional corrector arranged adjacent the condenser lens array and/or adjacent to, or integrated into, the objective lens array.

12b. The tool according to claim 12a, wherein the additional corrector comprises the corrector of any of embodiments 1 to 10.

13. A charged-particle tool comprising:

a condenser lens array configured to separate a beam of charged particles into a plurality of sub-beams along a respective beam paths and to focus each of the sub-beams to a respective intermediate focus;

an objective lens array configured to project the plurality of charged-particle beams onto a sample;

a corrector array comprising a plurality of elongate electrodes, the elongate electrodes arranged substantially orthogonal to the beam paths and in pairs either side of a line of beam paths; and wherein the corrector array is controllable to apply a potential difference between the pair of elongate electrodes so as to deflect the beam paths by a desired amount.

13a. A method of inspection comprising: dividing a beam of charged particles into a plurality of sub-beams; focusing each of the sub-beams to a respective intermediate focus; using a corrector to deflect the sub-beams to correct a macro-aberration of the sub-beams; and using a plurality of objective lenses to project the plurality of charged-particle beams onto the sample; wherein the corrector comprises along the beam path a first array of elongate electrodes, and a second array of elongate electrodes, the second array of elongate electrodes being substantially parallel to the first array of elongate electrodes, the first array adjoining the second array along the beam path, the elongate electrodes of the first array extending substantially perpendicular to the beam paths of the first plurality of sub-beams and arranged such that a second plurality of the sub-beams propagate between a pair of the elongate electrodes of the first array of elongate electrodes, the second plurality of sub-beams being a subset of the first plurality of sub-beams, the elongate electrodes comprising parallel plates extending parallel to the direction of propagation of the second plurality of sub-beams, preferably the elongate electrodes may have planar surfaces, more preferably directly facing the sub-beam paths.

14. A charged-particle tool comprising:

a condenser lens array configured to separate a beam of charged particles into a plurality of sub-beams along a respective beam paths and to focus each of the sub-beams to a respective intermediate focus;

an objective lens array configured to project the plurality of charged-particle beams onto a sample;

a corrector array comprising a plurality of elongate electrodes, the elongate electrodes arranged substantially orthogonal to the beam paths and in pairs either side of each beam path; and wherein the corrector array is controllable to apply macro-aberration corrections to the sub-beams orthogonal to the direction of the elongation of the elongate electrodes.

15. An inspection method comprising:

dividing a beam of charged particles into a plurality of sub-beams;

focusing each of the sub-beams to a respective intermediate focus;

using a corrector to deflect the sub-beams to correct a macro-aberration of the sub-beams; and using a plurality of objective lenses to project the plurality of charged-particle beams onto the sample; wherein the corrector comprises an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams.

16. A multi-beam charged-particle-optical system comprising:

a condenser lens array configured to separate a beam of charged particles into a first plurality of sub-beams along a respective beam path and to focus each of the sub-beams to a respective intermediate focus;

an array of objective lenses, each configured to project one of the plurality of charged-particle beams onto a sample;

a corrector comprising an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams; and an electric power supply configured to apply a potential difference between the pair of elongate electrodes so as to deflect the second plurality of sub-beams by a desired amount.

17. A charged-particle-optical element for a multi-beam projection system configured to project a plurality of charged particle beams onto a sample, the charged-particle-optical element comprising:

an array of elongate electrodes, the elongate electrodes extending substantially perpendicular to the beam paths of the first plurality of sub-beams and arranged such that a second plurality of the sub-beams propagate between a pair of the elongate electrodes, the second plurality of sub-beams being a subset of the first plurality of sub-beams; and an electric power supply configured to apply a potential difference between the pair of elongate electrodes so as to deflect the second plurality of sub-beams by a desired amount.

18. A charged-particle-optical element for a multi-beam projection system configured to project a plurality of charged particle beams onto a sample, the last charged-particle-optical element comprising:

a first support member comprising a first plate section and a plurality of first fingers projecting from an edge of the first plate section;

a second support member comprising a second plate section and a plurality of second fingers projecting from an edge of the second plate section;

a first plurality of electrodes extending from the first fingers to the second plate section; and a second plurality of electrodes extending from the second fingers to the first plate section.

19. A charged-particle-optical element according to embodiment 18 further comprising a first set of conductive traces provided on the first plate section and connecting to the second plurality of electrodes; and a second set of conductive traces provided on the second plate section and connected to the first plurality of electrodes.

20. A charged-particle-optical element according to embodiment 18 or 19 wherein the first and second support members are integral parts of a substrate.

21. A charged-particle-optical element according to embodiment 20 wherein the first and second support members have been formed by selective etching of the substrate.

22. A charged-particle-optical element according to any one of embodiments 19 to 21 wherein the first and second plate sections include a recess between adjacent fingers.

23. A charged-particle-optical element according to any one of embodiments 19 to 22 wherein the support members comprise an insulator, preferably ceramic, preferably silicon oxide, preferably glass.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A charged-particle tool comprising:

a condenser lens array configured to separate a beam of charged particles into a first plurality of sub-beams along a respective beam path and to focus each of the sub-beams to a respective intermediate focus;

an array of objective lenses, each objective lens configured to project one of the sub-beams onto a sample;

a corrector comprising along the beam paths a first array of elongate electrodes, and a second array of elongate electrodes, the second array of elongate electrodes being substantially parallel to the first array of elongate electrodes, the first array of elongate electrodes adjoining the second array of elongate electrodes along the beam paths, the elongate electrodes of the first array of elongate electrodes extending substantially perpendicular to the beam paths of the first plurality of sub-beams and arranged such that a second plurality of the sub-beams propagate between a pair of the elongate electrodes of the first array of elongate electrodes, the second plurality of sub-beams being a subset of the first plurality of sub-beams, the elongate electrodes comprising parallel plates extending substantially parallel to the direction of propagation of the second plurality of sub-beams; and an electric power supply configured to apply a potential difference between the pair of elongate electrodes of the first array of elongate electrodes so as to deflect the second plurality of sub-beams by a desired amount.

2. The tool according to claim 1, wherein there are a plurality of pairs of elongate electrodes arranged such that a respective second plurality of sub-beams propagates between each pair of elongate electrodes; and the electric power supply is configured to apply a respective potential difference between each pair of elongate electrodes.

3. The tool according to claim 2, wherein each of the elongate electrodes has sub-beams adjacent only one side thereof.

4. The tool according to claim 2, wherein the electric power supply is configured to apply potentials of opposite polarities to adjacent elongate electrodes.

5. The tool according to claim 2, wherein some of the elongate electrodes has sub-beams adjacent both sides thereof.

6. The tool according to claim 5, wherein the electric power supply is configured such that the potential applied to some of the elongate electrodes is given by a continually increasing function of position across the first array of elongate electrodes.

7. The tool according to claim 1, wherein the corrector comprises, along the beam paths, an additional array of elongate electrodes, the additional array of elongate electrodes being substantially perpendicular or substantially parallel to the first array of elongate electrodes.

8. The tool according to claim 1, wherein the corrector comprises a first set of elongate electrodes, a second set of elongate electrodes and a third set of elongate electrodes, one of the first, second or third set of elongate electrodes corresponding to the elongate electrodes of the first array of elongate electrodes, an angle between the first set of elongate electrodes and the second set of elongate electrodes being 60° and an angle between the second set of elongate electrodes and the third set of elongate electrodes being 60°.

9. The tool according to claim 1, wherein the corrector is arranged so that the intermediate focuses are between the elongate electrodes.

10. The tool according to claim 1, wherein the corrector is arranged adjacent the condenser lens array and/or adjacent to, or integrated in, the objective lens array.

11. The tool according to claim 1, wherein the corrector is configured to reduce at least one selected from: field curvature; focus error; and/or astigmatism.

12. The tool according to claim 1, wherein the corrector is configured to correct for a macro-aberration of the first plurality of sub-beams.

13. The tool according to claim 1, further comprising an additional corrector arranged adjacent the condenser lens array and/or adjacent to, or integrated in, the objective lens array.

14. The tool according to claim 13, wherein the additional corrector comprises along the beam paths a third array of elongate electrodes, and a fourth array of elongate electrodes, the fourth array of elongate electrodes being substantially parallel to the third array of elongate electrodes, the third array of elongate electrodes adjoining the fourth array of elongate electrodes along the beam path, the elongate electrodes of the third array of elongate electrodes extending substantially perpendicular to the beam paths of the first plurality of sub-beams and arranged such that a third plurality of the sub-beams propagate between a pair of the elongate electrodes of the third array of elongate electrodes, the third plurality of sub-beams being a subset of the first plurality of sub-beams, the elongate electrodes of the third array of elongate electrodes comprising parallel plates extending substantially parallel to the direction of propagation of the third plurality of sub-beams.

15. A method of inspection comprising:

dividing a beam of charged particles into a first plurality of sub-beams;

focusing each of the sub-beams to a respective intermediate focus;

using a corrector to deflect the sub-beams to correct a macro-aberration of the sub-beams; and using a plurality of objective lenses to project the plurality of sub-beams onto a sample, wherein the corrector comprises along beam paths of the sub-beams a first array of elongate electrodes, and a second array of elongate electrodes, the second array of elongate electrodes being substantially parallel to the first array of elongate electrodes, the first array of elongate electrodes adjoining the second array of elongate electrodes along the beam paths, the elongate electrodes of the first array of elongate electrodes extending substantially perpendicular to the beam paths of the first plurality of sub-beams and arranged such that a second plurality of the sub-beams propagate between a pair of the elongate electrodes of the first array of elongate electrodes, the second plurality of sub-beams being a subset of the first plurality of sub-beams, the elongate electrodes comprising parallel plates extending substantially parallel to the direction of propagation of the second plurality of sub-beams.

16. The method according to claim 15, wherein the elongate electrodes have planar surfaces directly facing the sub-beam paths.

17. The tool according to claim 1, wherein the parallel plates have planar surfaces directly facing the sub-beam paths.

18. The tool according to claim 2, wherein the pairs of elongate electrodes extend either side of a line of the second plurality of sub-beams, the line extending across the multi-beam arrangement of the sub-beams.

19. The tool according to claim 9, wherein the elongate electrodes are of the first array of elongate electrodes.

20. A multi-beam charged-particle optical system comprising:

a condenser lens array configured to separate a beam of charged particles into a first plurality of sub-beams along a respective beam path and to focus each of the sub-beams to a respective intermediate focus;

an array of objective lenses, each objective lens configured to project one of the plurality of sub-beams onto a sample;

a corrector comprising an array of elongate electrodes, the elongate electrodes extending substantially perpendicular to the beam paths of the first plurality of sub-beams and arranged such that a second plurality of sub-beams propagate between a pair of the elongate electrodes, the second plurality of sub-beams being a subset of the first plurality of sub-beams; and an electric power supply configured to apply a potential difference between the pair of elongate electrodes so as to deflect the second plurality of sub-beams by a desired amount.

* * * * *